United States Patent
Shiinoki et al.

(10) Patent No.: US 6,737,729 B2
(45) Date of Patent: May 18, 2004

(54) ANISOTROPIC ETCHING OF A SEMICONDUCTOR DEVICE USING TILTED ETCHING HOLES

(75) Inventors: Masakazu Shiinoki, Kyoto (JP); Kenji Sakurai, Kyoto (JP); Mitsuru Fujii, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/001,214

(22) Filed: Oct. 23, 2001

(65) Prior Publication Data

US 2003/0075780 A1 Apr. 24, 2003

(51) Int. Cl.[7] .............................................. H01L 29/82
(52) U.S. Cl. ...................... 257/619; 257/415; 257/419; 257/467; 257/622
(58) Field of Search ................... 257/627, 619, 257/620, 622, 628, 499, 506, 521

(56) References Cited

U.S. PATENT DOCUMENTS

| | | | | |
|---|---|---|---|---|
| 4,766,666 A | * | 8/1988 | Sugiyama et al. | 29/610 |
| 4,771,638 A | * | 9/1988 | Sugiyama et al. | 73/721 |
| 4,808,260 A | * | 2/1989 | Sickafus et al. | 156/644 |
| 5,041,190 A | * | 8/1991 | Drake et al. | 156/647 |
| 5,452,610 A | * | 9/1995 | Kleinhaus et al. | 73/204.26 |
| 5,467,649 A | * | 11/1995 | Reihlen et al. | 73/204.26 |
| 5,656,777 A | * | 8/1997 | Petri et al. | 73/504.12 |
| 6,300,554 B1 | * | 10/2001 | Du et al. | 136/21 |
| 2002/0034878 A1 | * | 3/2002 | Kimata et al. | 438/700 |

\* cited by examiner

Primary Examiner—Nathan J. Flynn
Assistant Examiner—Fazli Erdem
(74) Attorney, Agent, or Firm—Osha Novak & May L.L.P.

(57) ABSTRACT

A semiconductor device is provided that simplifies wiring pattern and is capable of being etched through an etching hole as a concavity is produced over a short time period. A dielectric film 12 is formed so as to shield the concavity formed upon the upper surface of a silicon substrate 10. A circuit pattern that has a thermoelectric conversion element 18 is formed upon the dielectric film. The upper surface of the silicon wafer becomes a (100) surface, and a first etching hole 16 extending in the <110> direction of the silicon substrate and a second etching hole 17 extending in the <-110> direction are formed. These holes intersect in a cross shape. Shapes of the first and second etching holes become parallelograms which have oblique sides tilted with respect to <110> and <-110>. Imaginary rectangles passing though the vertices of the first and second etching holes are continuous. As a cross shape is removed from the silicon substrate, etching is rapid due to the appearance of (411) surfaces at the intersecting part.

17 Claims, 17 Drawing Sheets

US 6,737,729 B2

ANISOTROPIC ETCHING OF A SEMICONDUCTOR DEVICE USING TILTED ETCHING HOLES

BACKGROUND OF INVENTION

The present invention relates to a semiconductor device.

A semiconductor device having a concavity at a surface of a silicon substrate of a flow sensor, a thin dielectric film provided at the silicon substrate surface so as to cover this concavity, and a resistor element of a predetermined shape formed on this dielectric film has been disclosed by, for example, Japanese Patent Publication No. TOKUKOUHEI 3-52028.

The semiconductor device having above structure is manufactured by forming a dielectric film on the surface of the silicon substrate and then forming a concavity thereon. The device may be manufactured by a method of etching the silicon substrate from the backside surface (the surface on which dielectric film is not formed) or a method of forming an etching hole for etching the silicon substrate through the dielectric film and then causing etching solution to penetrate through this etching hole to etch the silicon substrate.

In the latter method, because the shape of etching hole formed through the dielectric film greatly affects to the productivity and characteristics of the device including etching time and effective region, careful attention must be paid to the designing of the etching hole. Conventionally, such a shape has generally been a pattern directed toward 45° relative to <110> for a silicon wafer having a (100) surface and <110> direction.

In a conventional semiconductor device (sensor) having a dielectric film, when an etching hole is formed to etch silicon on the dielectric film surface, because the resistor element or thermoelectric conversion element to be formed on the dielectric film can neither be formed efficiently nor over a wide range at the place where the etching hole has been formed, high output has been prevented. Furthermore, because thermal insulation property is deteriorated, a problem of output voltage drop is also caused.

In addition, the etching hole is normally oriented at a 45° tilt relative to <110> and formed in parallel with the <100>. In this case, the etching hole region becomes large with respect to the entire membrane, and device wiring becomes complicated.

Furthermore, under the conventional etching pattern, the device is not formed in parallel with dicing directions of the device, but is generally tilted by 45°, it becomes necessary to tilt the device during mounting. As a result, operating efficiency becomes worsened.

This invention has been made taking into consideration of the above mentioned circumstances. The object of the present invention is to provide a semiconductor device that is capable of solving the above mentioned problems, simplifying the wiring pattern, improving yield, lowering resistivity of the wiring, and attaining miniaturization, wherein the device can be readily formed with good efficiency, and manufacture of the concavity can be performed over a short time period by etching via an etching hole.

SUMMARY OF INVENTION

In order to achieve the above mentioned object, the semiconductor device according to the present invention comprises a semiconductor substrate having a (100) surface and <110> direction and a concavity formed by anisotropic etching on a surface that is parallel with the (100) surface, a dielectric film provided on the semiconductor substrate so as to cover the concavity, and a circuit pattern having at least one of a resistor element and a thermoelectric conversion element in a predetermined shape formed on the dielectric film. The dielectric film facing the concavity is provided with a first etching hole extending in the <110> direction of the semiconductor substrate, and a second etching hole extending in the <-110> direction of the semiconductor substrate. The first and second etching holes are formed such that these holes have a side tilted with respect to the <110> and <-110> (In the implemented embodiment, the side corresponds to "shorter sides 16b, 17b, and tilted sides 16c, 17c, or tilted sides of a trapezoid") and imaginary rectangles passing through the apexes of the first and second etching holes are directly or indirectly continuous.

The etching rates in the direction toward the faces along the <110> direction and <-110> directions are low. Therefore, for example, if etching is carried out of a rectangular pattern extending in these directions, etching progresses only toward the substrate interior, i.e., toward the (100) surface. For this reason, a conventional etching hole has been given a pattern morphology that extends in directions at 45° relative to the <110> direction. The inventors of the present invention tested and were successful in the formation of a desired concavity by using an etching hole of a pattern shape extending in the <110> direction.

Namely, after forming a dielectric film having first and second etching holes on the entire surface of a semiconductor substrate, the semiconductor substrate is dipped into an etching solution. Then, the surface of the semiconductor substrate exposed by the etching holes is etched toward the (100) surface. By providing sides (tilted by 45° in an embodiment) tilted in the <110> and <-110> directions, etching proceeds toward a surface that is in parallel with the sides. By this means, a part of imaginary rectangle shape is removed by the etching.

Then, because the imaginary rectangle is formed such that these imaginary rectangles are directly or indirectly continuous, the region removed due to the first etching hole and the region removed due to the second etching hole are connected. Then, the (411) surface appears. As a result, as explained in detail in the embodiment, etching proceeds toward this (411) surface in a high speed. In other words, etching advances substantially from the part at the point of intersection of the first and second etching holes. By doing this, a concavity in a rectangular shape having sides that is perpendicular and parallel with the <110> direction is formed. Because of the use of a highest speed etching of the (411) surface, a concavity can be formed over a shorter time period than using a conventional technology.

Then, due to formation of the first and second etching holes extending in the <110> direction and <-110> direction, the part of the dielectric film facing the concavity is divided into rectangles by these etching holes. As a result, wiring becomes simple, yield is increased, and manufacturing is easy without causing cutting of the wiring pattern.

Here, "imaginary rectangles that directly connect" means that the imaginary rectangles based upon each first and second etching hole contact to each other (either linear contact or point contact), or partially overlaps to each other. Also, "imaginary rectangles that indirectly connect" means that the imaginary rectangles are connected to each other via another etching hole that is separately provided.

Preferably, the first and second etching holes intersect at the center of the concavity. A concavity can be formed over a short time period since etching proceeds toward the perimeter from the intersection part. Because the regions on the dielectric film divided by each of the etching holes are maintained equally symmetrically, that balance is good, and layout of wiring can be easily carried out.

Another etching hole may be provided at the intersecting part of the first etching hole and the second etching hole. It becomes possible to form the concavity more rapidly when an etching hole is provided at the intersecting part. Also, the imaginary rectangle A due to the first etching hole and the imaginary rectangle B due to the second etching hole may be continuous via the imaginary rectangle (including the case of an imaginary square) due to the etching hole at the intersection part. It is not necessary that imaginary rectangle A and imaginary rectangle B be directly continuous. In other words, layout pitch can be expanded.

Also, a supplementary etching hole may be provided at the intersecting part of adjacent first etching holes or adjacent second etching holes. Depending on the pattern shape of the first and second etching holes, if the imaginary rectangles due to such holes are made to be directly continuous, adjacent first (second) etching holes may end up continuous together. In this state, there is a danger that the dielectric film be cut at such a part. Therefore, by providing a supplementary etching hole, it becomes possible to indirectly connect the imaginary rectangles due to the first and second etching holes via a region that is removed due to this supplementary etching hole.

Possible specific examples of the application of the semiconductor device of the present invention include various types of devices such as flow sensors; thermal sensors, infrared sensors, temperature sensors, or micro-heaters. As an example, the above mentioned circuit pattern can be equipped with a first heater element of a fixed specified shape for use generating heat and a second heater element that senses variation of temperature upon the above mentioned dielectric film. This invention is achieved by the embodiment shown in FIG. 17.

Moreover, the above mentioned circuit pattern as another embodiment can comprise upon the above mentioned dielectric film a first resistor element having a specified shape used for constant generation of heat and a second thermoelectric conversion element that senses change of temperature. An embodiment of this invention is indicated by the working example shown in FIG. 18.

Assuming use of the above mentioned structures, the second etching hole is preferably provided at the far end of the continuing first etching hole. By use of this structure as shown in FIG. 17–FIG. 19, the part of the dielectric film opposite the concavity is divided into rectangles by the first and second etching holes. Then if a first etching hole is provided centrally as in the working examples, this first etching hole becomes nearly equidistant from the perimeter (where the dielectric film and semiconductor wafer are joined together), and a resister element or thermoelectric conversion element can be formed over a wide surface area. Furthermore, spacing between the hot contact and the cold contact of the thermoelectric conversion element can be widened over the entire thermoelectric conversion element (it becomes possible to place a contact point in the vicinity of the center of the dielectric film), and thermal insulation can be increased between both contacts. Therefore output voltage increases (1.2 times relative to that when etching holes are laid out at the conventional 45° angle).

DETAILED DESCRIPTION

Figure 1:
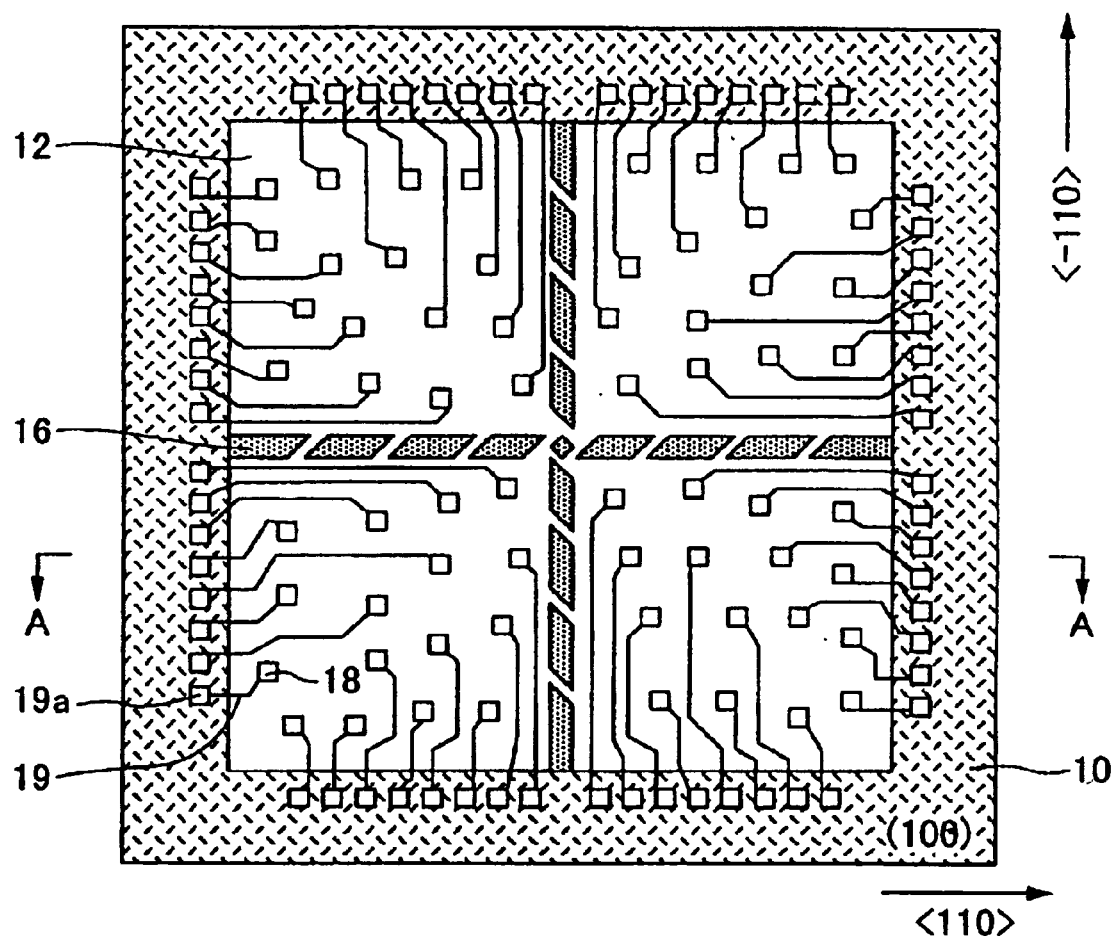
FIG. 1 is a top view showing a preferred embodiment of a semiconductor device according to the present invention.

Exemplary embodiments of the invention will be described with reference to the accompanying drawings. Like items in the drawings are shown with the same reference numbers.

Figure 2:
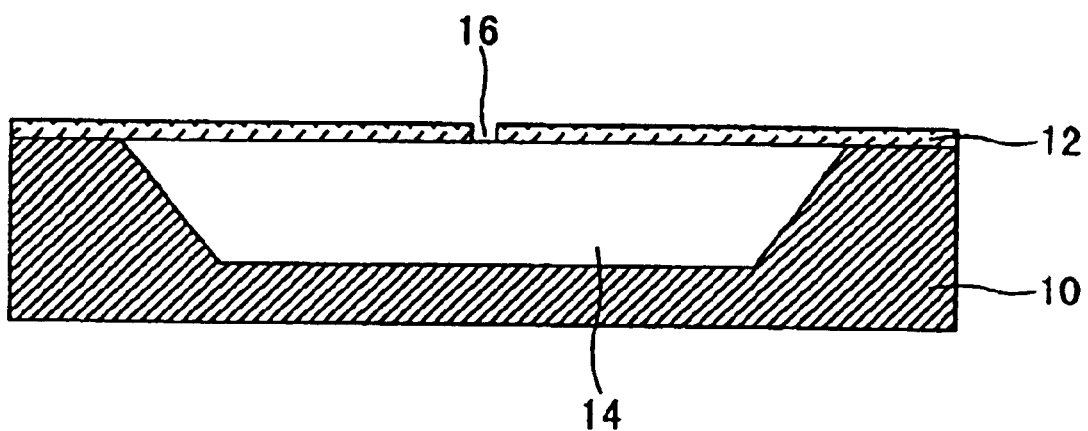
FIG. 2 is a cross-section cut along the A—A line of FIG. 1 viewed from the direction of the arrow.

A preferred embodiment of the present invention is explained below. As shown in FIG. 1 and FIG. 2, a dielectric film 12 is formed on the upper surface of a silicon wafer 10. At this time, a bottom-containing concavity 14 is formed that has a rectangular planar shape. The open part of this concavity 14 is covered by the dielectric film 12.

Then, first etching holes 16 oriented parallel to <110> and second etching holes 17 oriented parallel to <-110> are formed in the part of the dielectric film 12 that is facing the concavity 14. These first etching holes 16 and second etching holes 17 intersect at the central part and are laid out to form a cross as a whole. The above intersection is formed so as to be placed at the center of concavity 14.

The shapes of the individual etching holes 17 and 16 are parallelograms. The long side 16a is formed extending parallel to <110> or <-110>. Also, each short side 16b or 17b is tilted 45° relative to the respective long side 16a or 17b. An etching hole 15 at the central intersection part is formed in a square shape parallel to the short sides 16b and 17b. Namely, it is tilted 45° relative to the above mentioned <110> direction or <-110> direction.

Further, if rectangles in exterior contact with each etching hole 15, 16, and 17 are imagined, etching holes 15–17 are formed such that at least one part of the imaginary rectangles of adjacent etching holes contact or overlap to each other.

Also, numerous thermoelectric conversion elements 18 are laid out on the upper surface (above the concavity 14) of dielectric film 12. One end of an output wiring pattern 19 is connected to each of these thermoelectric conversion elements 18. Other end of output wiring pattern 19 is drawn to the exterior perimeter part where silicon substrate 10 and dielectric film 12 are joined to each other. A terminal 19a is formed at the other end, such that a signal detected by the thermoelectric conversion element 18 can be output to the exterior through this terminal 19a.

The manufacturing process of the present embodiment comprises formation of dielectric film 12 on the surface of flat (lacking concavity 14) silicon substrate 10, formation of thermoelectric conversion element 18 and output wiring pattern 19 on the surface of this dielectric film 12, and formation of each etching holes 15–17 at prescribed positions on dielectric film 12 by using photolithographic technology.

Thereafter, by dipping the silicon substrate 10 into an etching solution, etching solution gradually etches the surface of silicon substrate 10 that is exposed through each of these etching holes 15–17. Finally, concavity 14 of the above mentioned prescribed shape is formed. A prescribed protective film formed on the backside of silicon substrate 10 is not removed during this etching.

Next, the principles of formation of concavity 14 from the planar rectangular shape (inverted truncated pyramidal space) due to the above mentioned pattern shape of etching holes 15–17 will be explained. First, as is widely known, by performing anisotropic etching on a surface that is parallel to the (100) plane, the parts apertured by etching holes 15–17 are etched in the <100> direction, namely, a direction that is perpendicular to the substrate surface. In addition, as to the horizontal direction, in a case of the etching hole formed in the <110> direction and <-100> direction, (111) surface is exposed in those direction. For this reason, due to the difference of etching rates, etching does not proceed well. The etching proceeds toward the surface that is in parallel with the short sides 16b, 17b that are intersecting at 45° with each of these directions.

Figure 3:
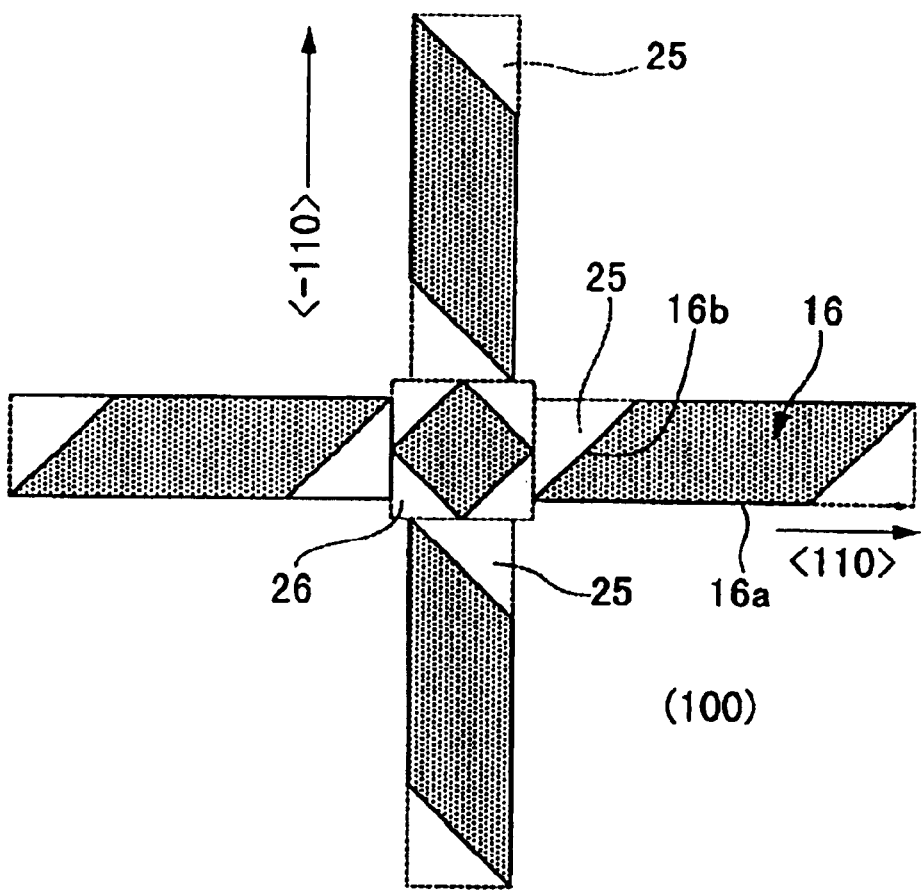
FIG. 3 is a drawing explaining use of etching (concavity formation).

By this means, as indicated by the dashed lines in FIG. 3, silicon substrate 10 in a region 25 of an imaginary rectangle that is in exterior contact with the vertexes of first etching hole 16 and second etching hole 17 is etched. Similarly, silicon substrate 10 in a region 26 of an imaginary square shape contacting the vertexes of square-shaped etching hole 15 is etched. Thereafter, each region 25 and 26 becomes connected with the neighboring region. As a result, as indicated by hatching in FIG. 4, etching removes the surface of silicon substrate 10 in a cross-shaped region 27 along each of the etching holes 15–17.

Figure 4:
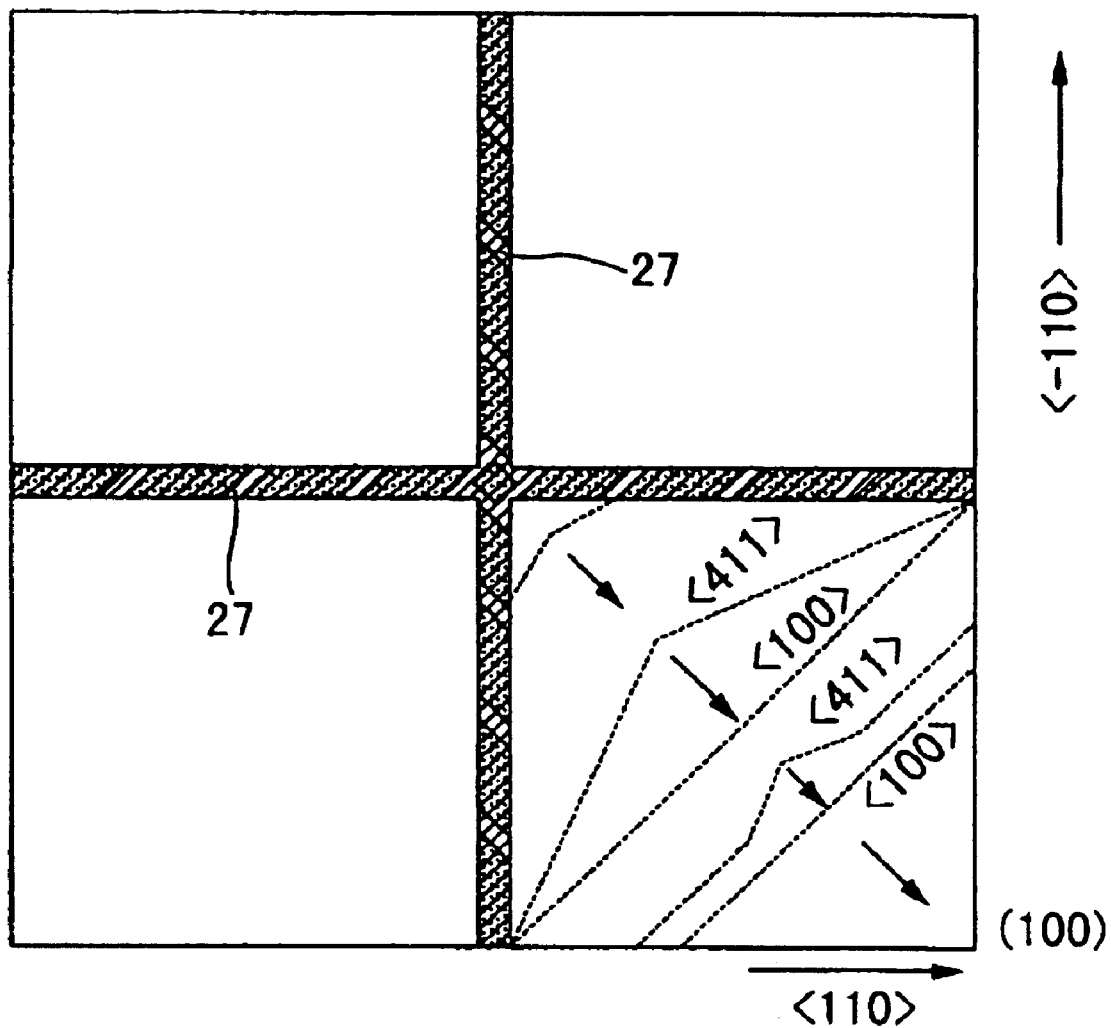
FIG. 4 is a drawing explaining use of etching (concavity formation).

In this manner, by intersection of the etched regions 27, etching proceeds rapidly in the direction indicated by arrow symbols in FIG. 4 due to the appearance of the (411) plane that is the fastest etching plane. That is to say, region 29 (not etched during this step) divided by regions 27 that is removed by etching proceeds in the diagonal-angle direction of each region 29 due to etching toward the (411) plane.

Thereafter, upon reaching the diagonal line, the (441) surface disappears, and the newly exposed (100) surface controls etching. Then, as the interior of region 29 is etched, the perimeter becomes (111) surfaces. Etching is not carried out further, and etching ends. A planar roughly rectangular-shaped concavity 14 is formed by this means.

It therefore becomes possible by this means to produce concavity 14 over a short time period in comparison to the conventional method (formation of an etching hole of rectangular shape tilted at 45° relative to the <100> or <-110> directions).

Although square-shaped etching hole 15 is provided in the intersecting part of first etching hole 16 and second etching hole 17 in the above mentioned embodiment, it is also permissible not to provide etching hole 15 if the exterior contacting imaginary rectangular regions 26 connect with one another for etching holes 16 and 17.

Moreover, although a parallelogram was used as the shape of first etching hole 16 and second etching hole 17 in the above embodiment, a hexagonal shape may also be used for which both tips have respective filleting at two angles. That is to say, tilted sides 16c and 17c connected at both edges with long sides 16a and 17a are tilted at a 45° angle relative to each long side 16a and 17a which is parallel with the <100> direction or <-110> direction.

Furthermore, vertexes of this first etching hole 16 and second etching hole 17 in external contact with imaginary rectangular shaped regions 25 are formed so as to connect by contact, partial overlap, etc. Contacting morphology is not limited to the linear connection of the above mentioned embodiment. Point contact is also permissible as indicated by the intersecting part of FIG. 5(a), since (411) appears at the intersecting part even for this morphology.

Furthermore, although in the illustrated examples, a separate etching hole is not provided as in the above mentioned embodiment, this intersecting region 28 also is surrounded by four regions 25 (parts that are etched) of imaginary rectangular shape such that (411) surfaces appear. Therefore, rapid etching and removal occurs in the same manner as described above.

Figure 5A:
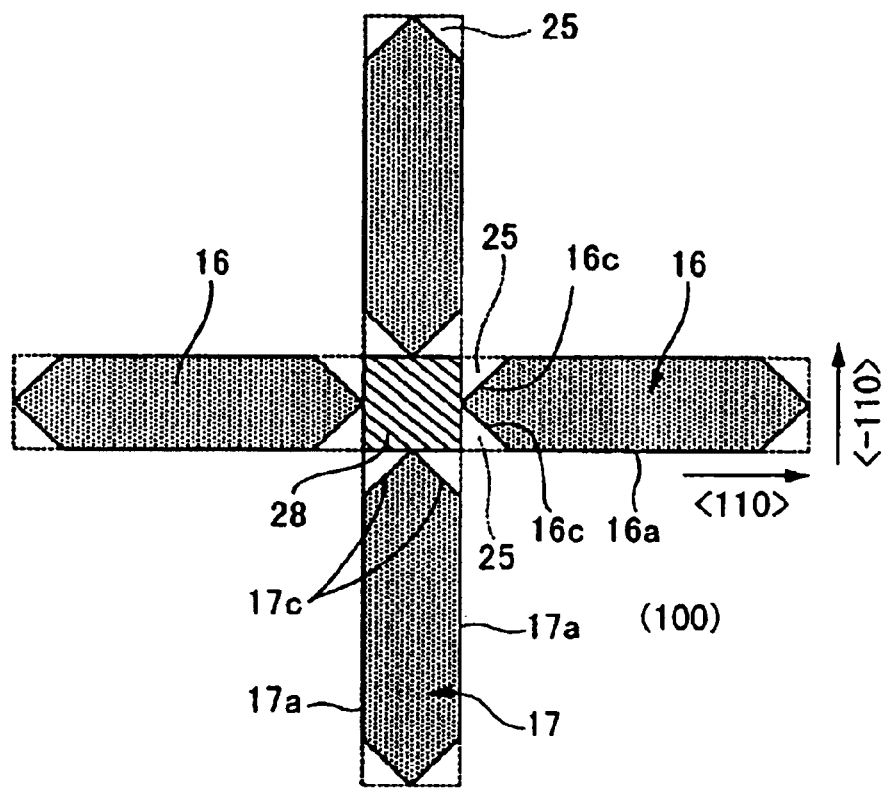
FIG. 5 is a drawing showing another embodiment of the etching hole.
Figure 5B:
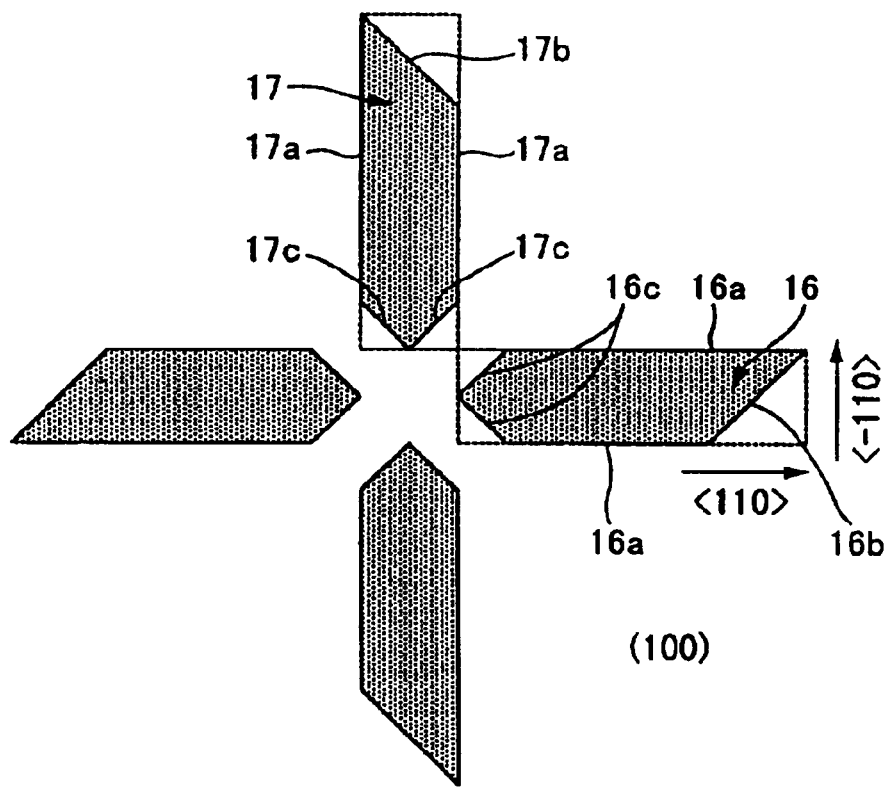

Moreover, as a separate morphology of etching holes 16 and 17, it is permissible for one of the length-wise direction sides as shown in FIG. 5(b) to be provided with a single short side 17b, and the other length-wise direction side to be provided with two tilted sides 17c in the same manner as FIG. 5(a), such that the shape tapers toward the center. Also in this case region 25 imaginary rectangles in exterior contact with the vertexes of etching holes 16 and 17 are first etched. Thereafter concavity 17 is formed as etching proceeds in the direction of the emergent (411) planes connected to this region 25.

Figure 6:
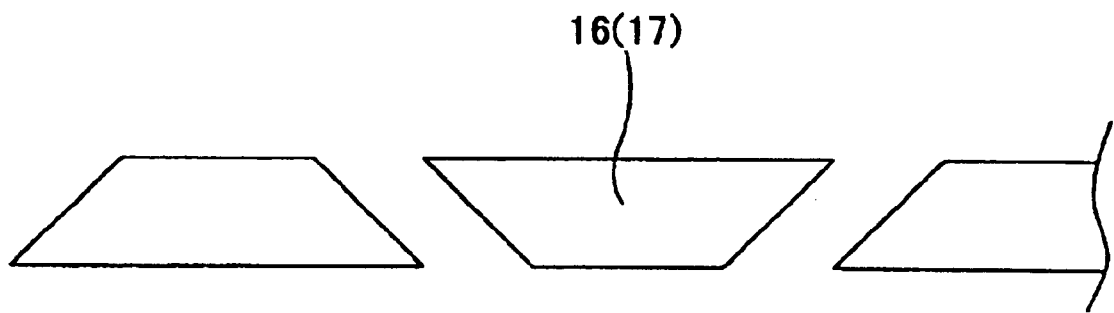
FIG. 6 is a drawing showing another embodiment of the etching hole.

Furthermore, as another morphology of etching holes 16 and 17, it is permissible to use an isosceles trapezoid with a base angle of 45° as shown in FIG. 6, wherein sides tilted at 45° relative to the <100> direction or <-110> direction and sides parallel to the <100> direction or <-110> direction must be provided.

Furthermore, if a pattern such as that of FIG. 5(a) is formed, when the regions 25 of imaginary rectangular shape in exterior contact with vertices of first contact hole 16 and second contact hole 17 line up in the same direction so as to directly contact, it is not desirable that vertexes P at the ends of this first etching hole 16 and this second etching hole 17 should connect.

Figure 7A:
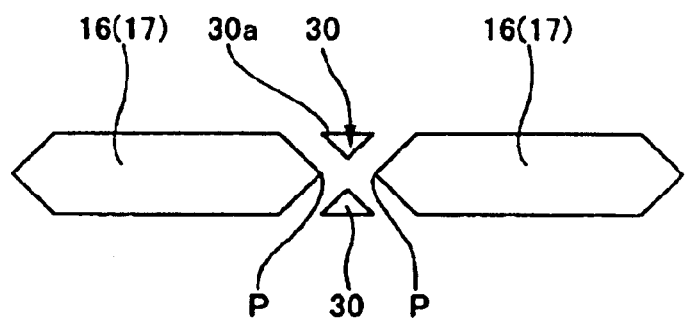
FIG. 7 is a drawing showing another embodiment of the etching hole.

Therefore, vertexes P are separated by a predetermined distance as shown in FIG. 7(a), and rectangular-shaped supplementary etching holes 30 are provided between vertexes P. These supplementary etching holes 30 are shaped as isosceles right triangles for which a base side 30a is parallel to the <100> direction or <-110> direction. The imaginary rectangular region 32 in exterior contact with this triangle (three vertexes) is laid out so as to connect with regions 25 of the imaginary rectangles in exterior contact with first etching hole 16 and second etching hole 17.

Adjacent regions 25 become connected through region 32, making possible continuation as a single elongated region. Moreover, although etching to a prescribed depth occurs according to the above mentioned principles, region 33 surrounding these regions 25 and 32 is not etched and remains behind. However, by connection of etched parts at regions 25 and 32, (411) surfaces appear, and this region 33 is also removed.

Figure 7B:
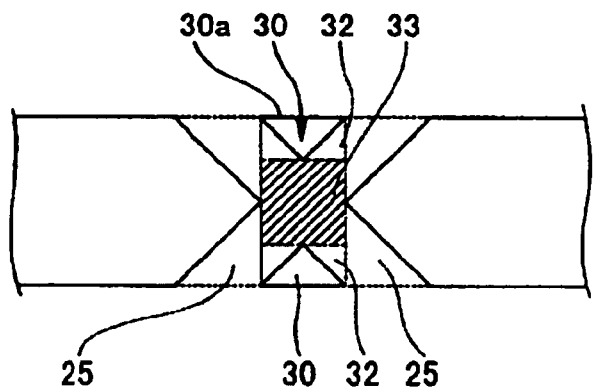
Figure 8:
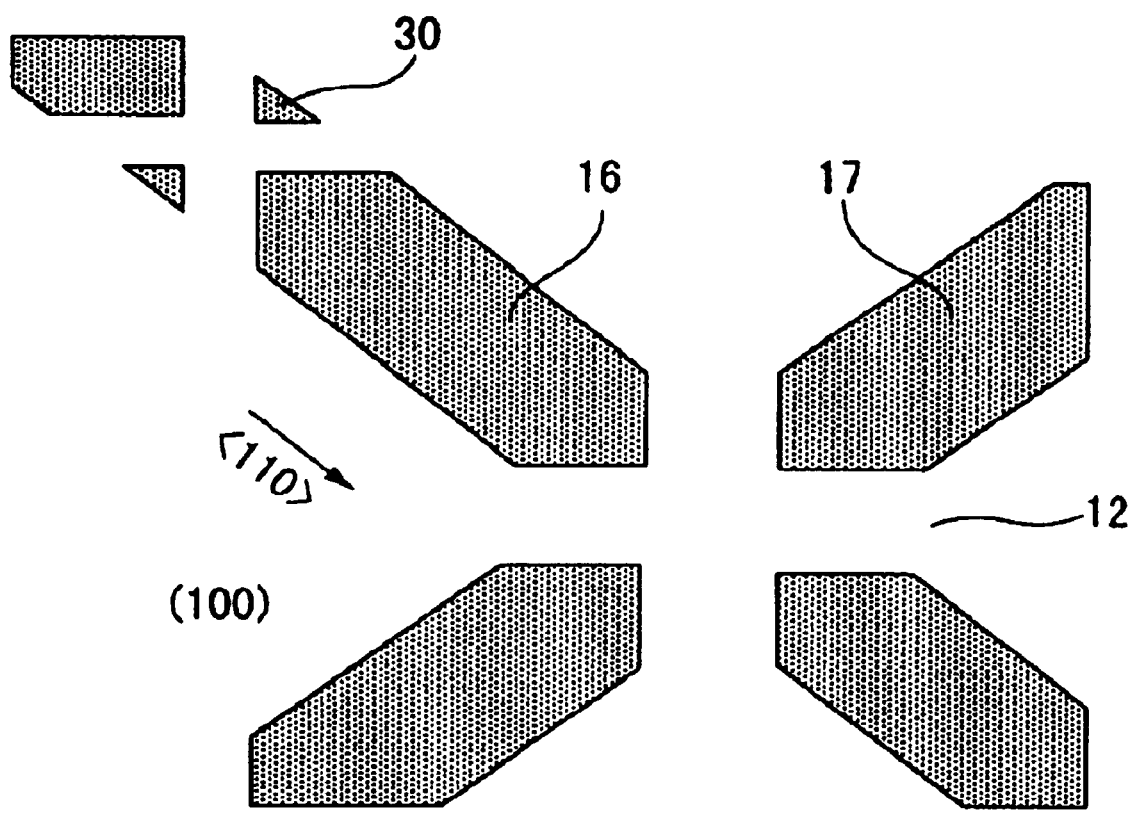
FIG. 8 is a drawing showing a specific etching process.
Figure 9:
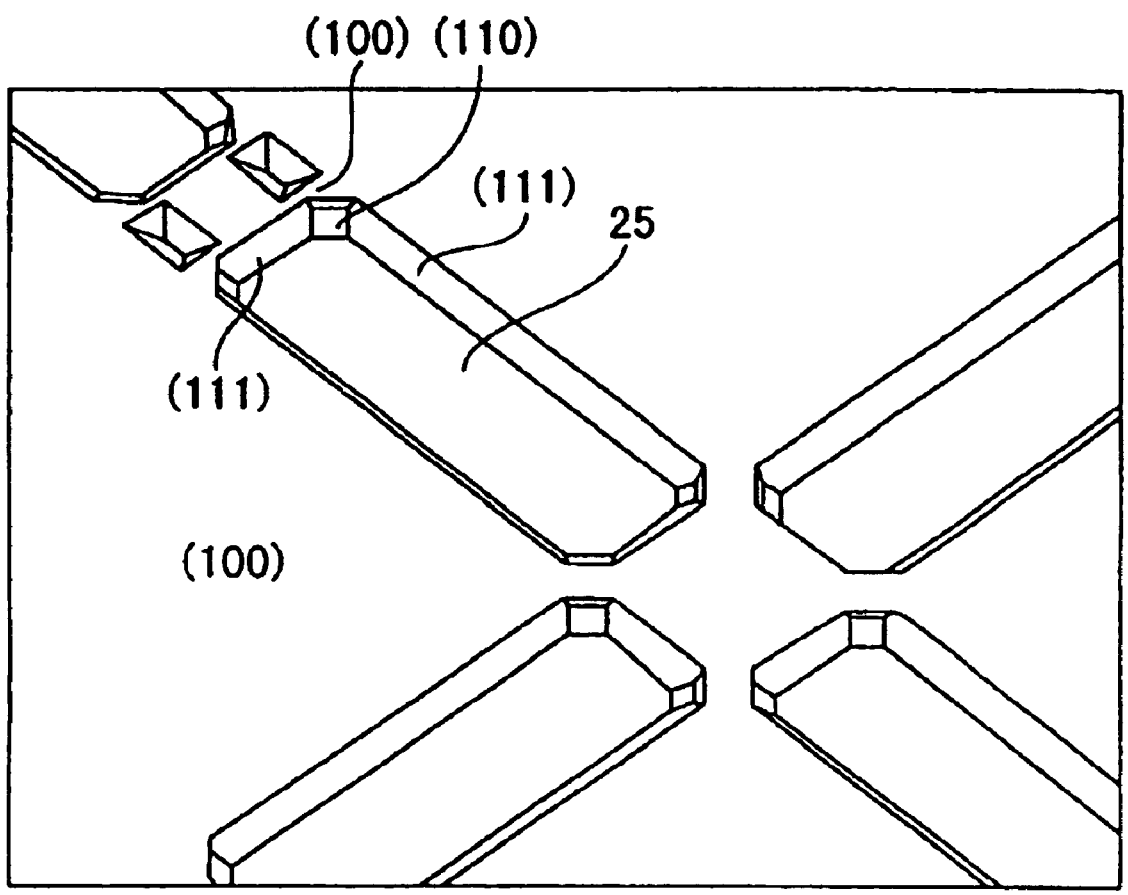
FIG. 9 is a drawing showing a specific etching process.

Conditions as actual etching proceeds will be explained using successive figures. First, in the case of a layout of etching holes in the pattern shown in FIG. 8 (pattern indicated by FIG. 5 (a) and FIG. 7), as shown in FIG. 9 during the initial roughly 15 minutes, etching proceeds toward the (110) surfaces parallel with etching hole oblique sides 16c or 17c, and toward the surface parallel to the (100) plane. Etching doesn't proceed at long sides 16a and 17a parallel with the (111) plane.

Figure 10:
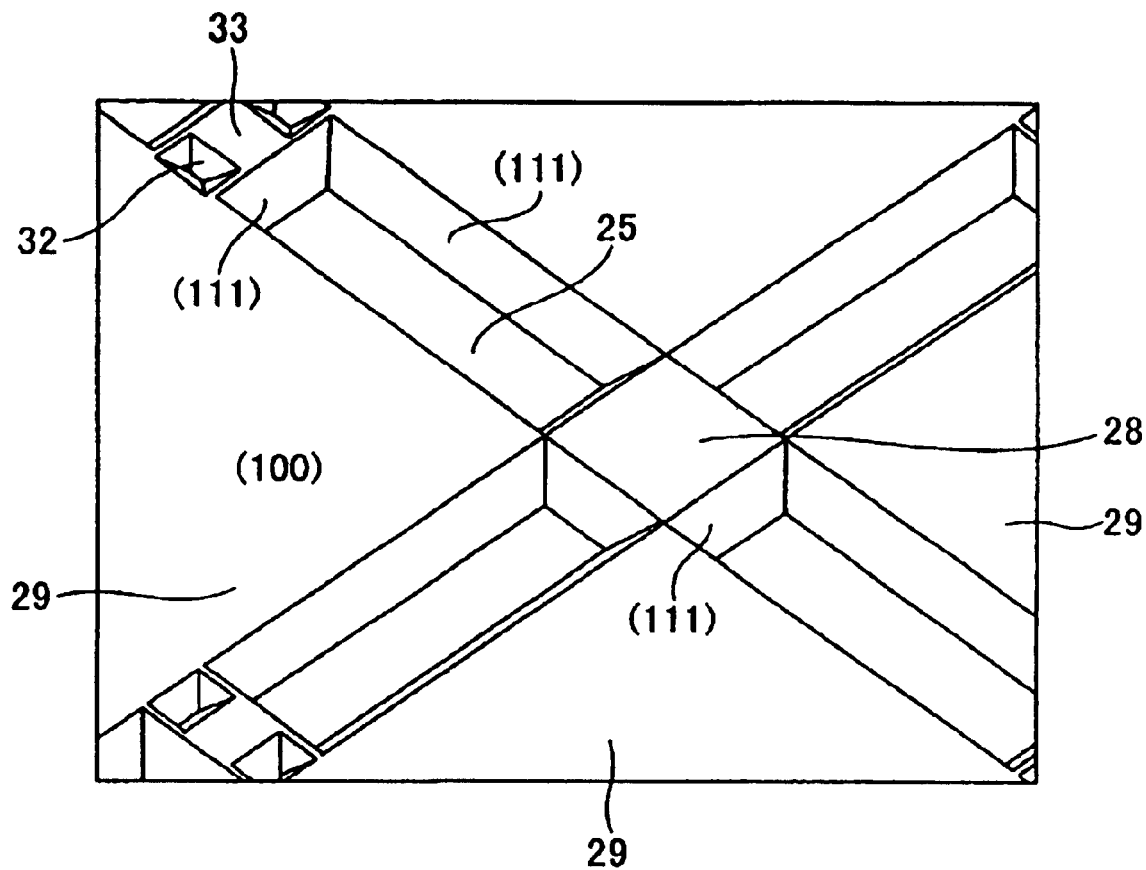
FIG. 10 is a drawing showing a specific etching process.
Figure 11:
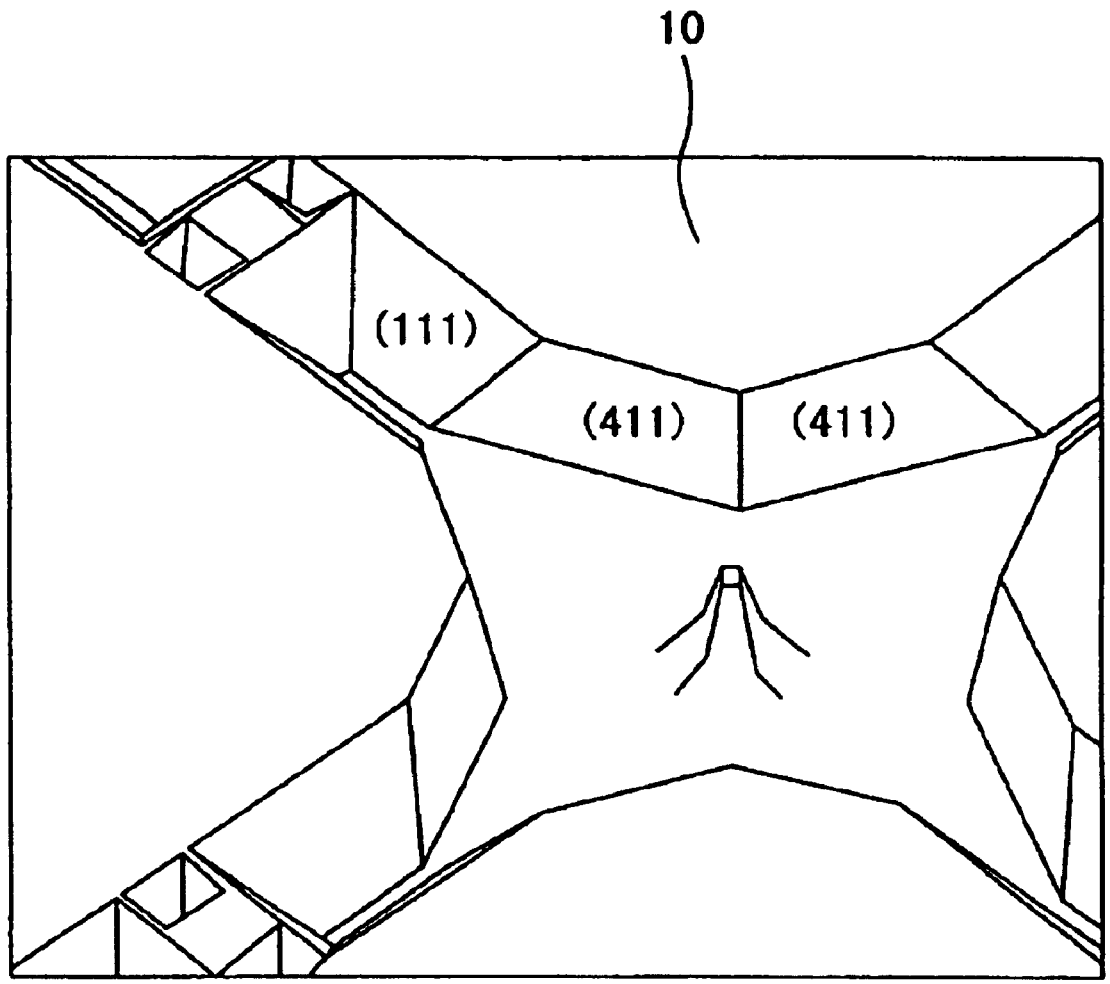
FIG. 11 is a drawing showing a specific etching process.

Then, after 30 minutes have passed, etching continues further as shown in FIG. 10 so that etching stops when each region 25 and 32 is surrounded by (111) surfaces. Each region connects at this time.

Figure 12:
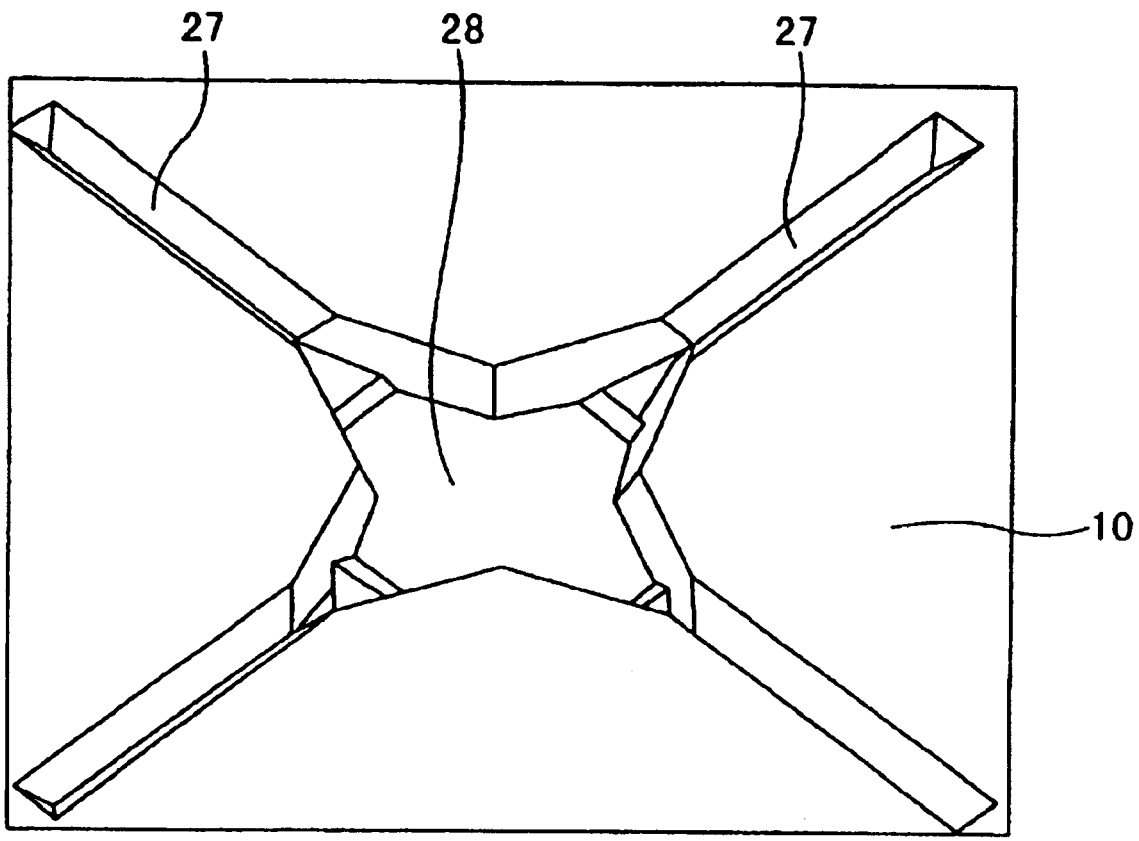
FIG. 12 is a drawing showing a specific etching process.

Then, due to appearance of the (411) due to such connection, etching proceeds rapidly toward (411) planes for heretofore non-etched regions 28, 29, and 33. By this means, the state shown in FIG. 11 occurs after passage of 1 hour. After the passage of 2 hours, regions 28 and 32 are entirely removed as shown in FIG. 12. Here FIG. 8 through FIG. 11 are drawn at the same scale, and FIG. 12 and beyond are drawn at 1/10th the scale used for FIG. 11 and earlier drawings.

Figure 13:
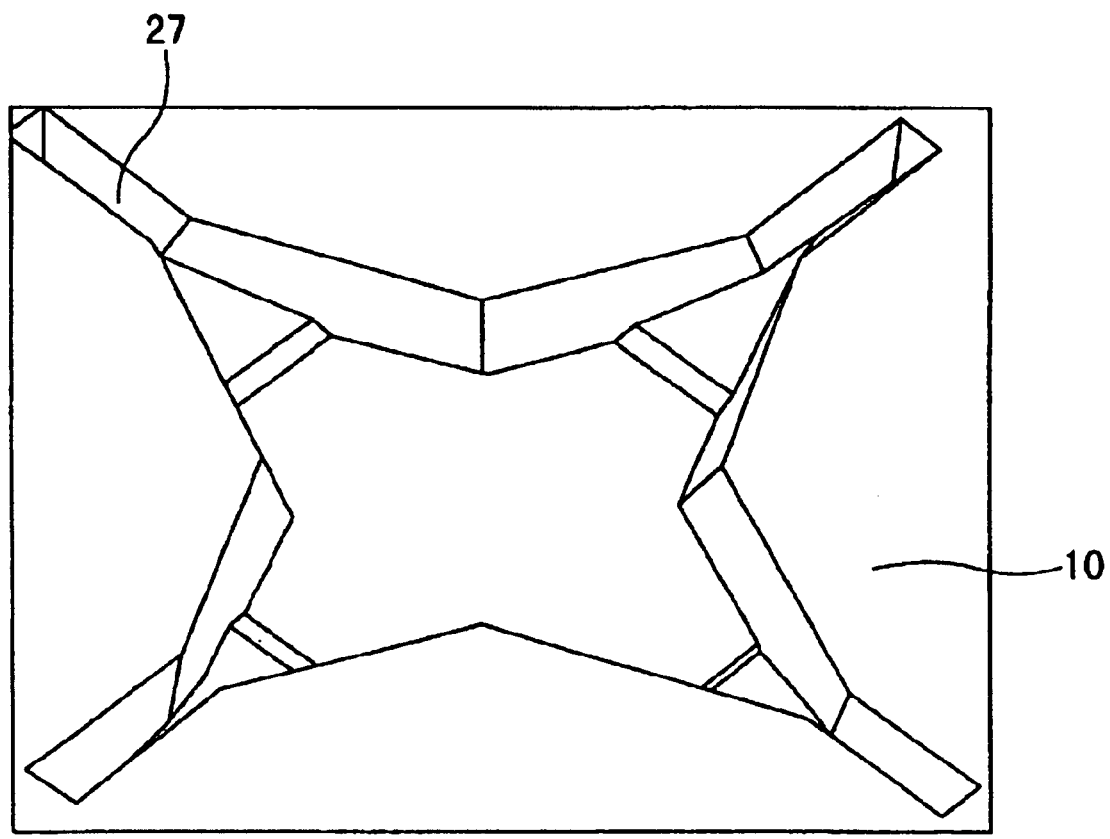
FIG. 13 is a drawing showing a specific etching process.
Figure 14:
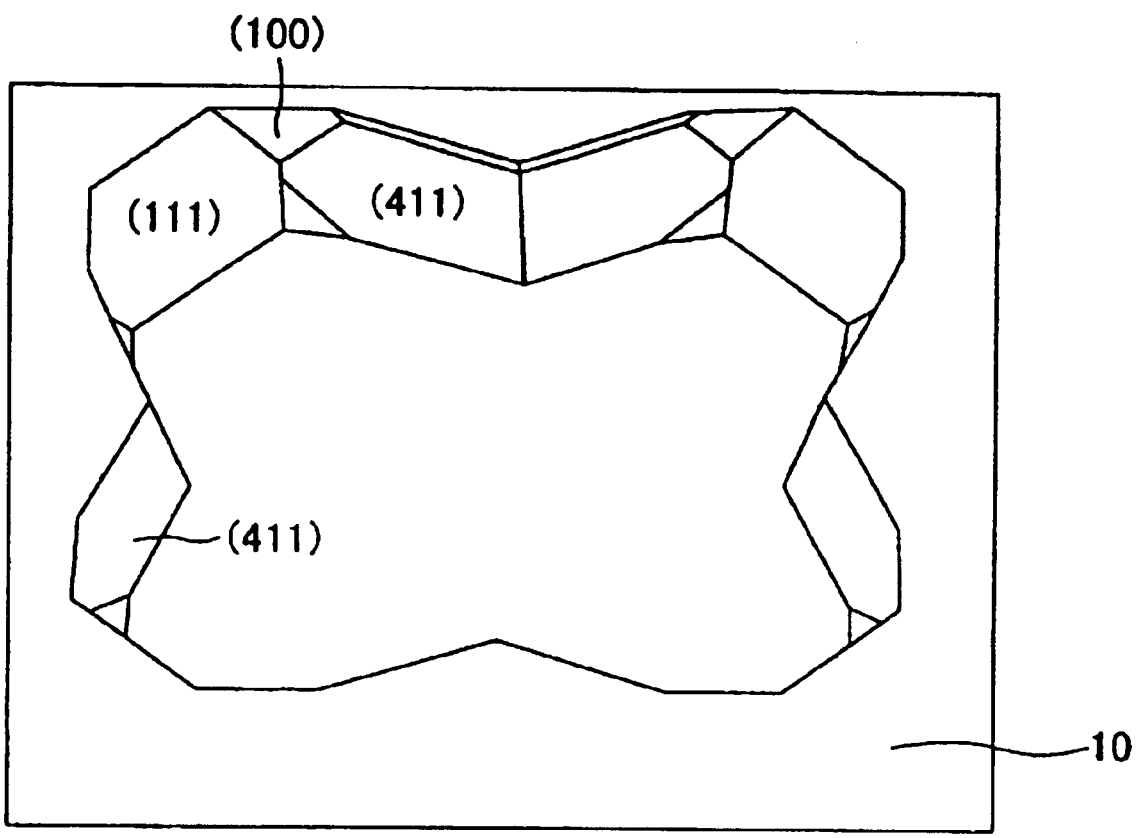
FIG. 14 is a drawing showing a specific etching process.

Thereafter, time passes, resulting in FIG. 12 (passage of 2 hours), FIG. 13 (passage of 4 hours), and FIG. 14 (passage of 8 hours). Region 29 is also mostly etched. (411) surfaces still remain in this state.

Figure 15:
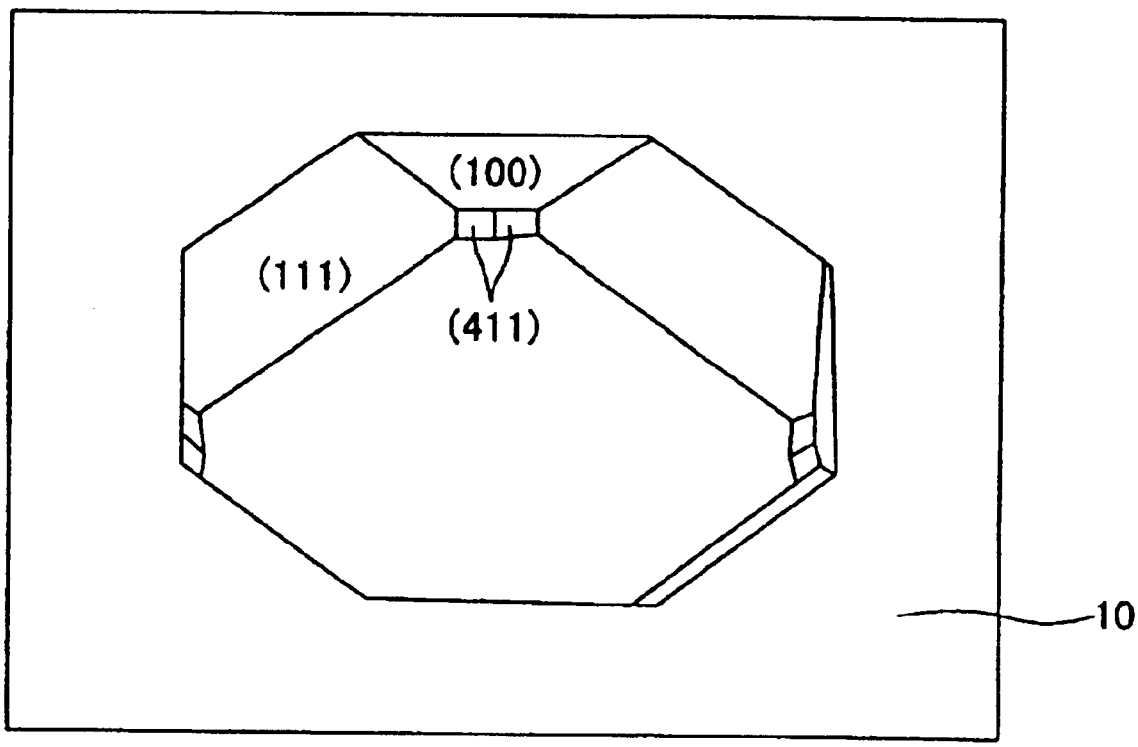
FIG. 15 is a drawing showing a specific etching process.
Figure 16:
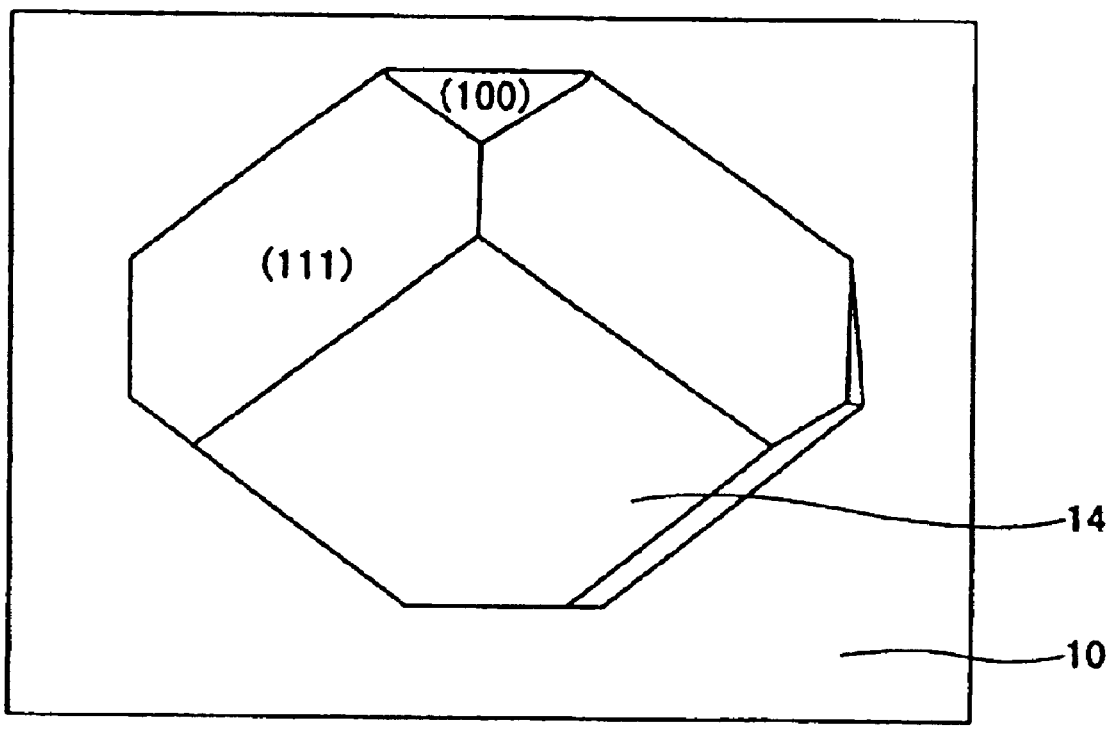
FIG. 16 is a drawing showing a specific etching process.

Then, upon passage of 12 hours, (411) surfaces almost disappear as shown in FIG. 15, and etching proceeds toward the (100) surfaces. Thereafter, as shown in FIG. 16 (passage of 16 hours), the (411) surfaces disappear, and etching proceeds controlled by the (100) surfaces. A roughly rectangular concavity 14 is finally formed, and etching stops. All times passed in the above mentioned explanation are relative to the etching start time.

Figure 17:
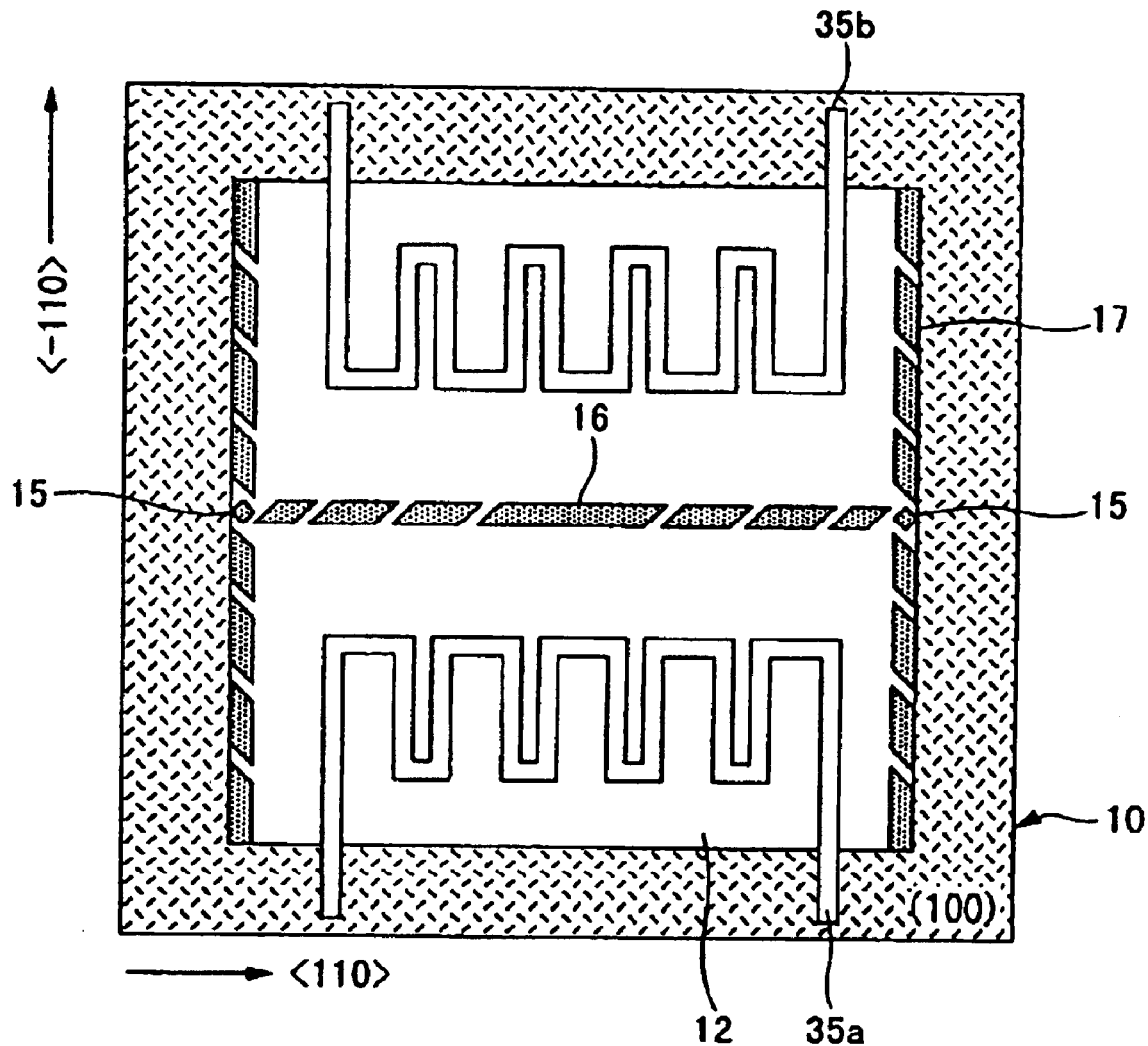
FIG. 17 is top view showing another preferred embodiment of a semiconductor device according to the present invention.
Figure 18:
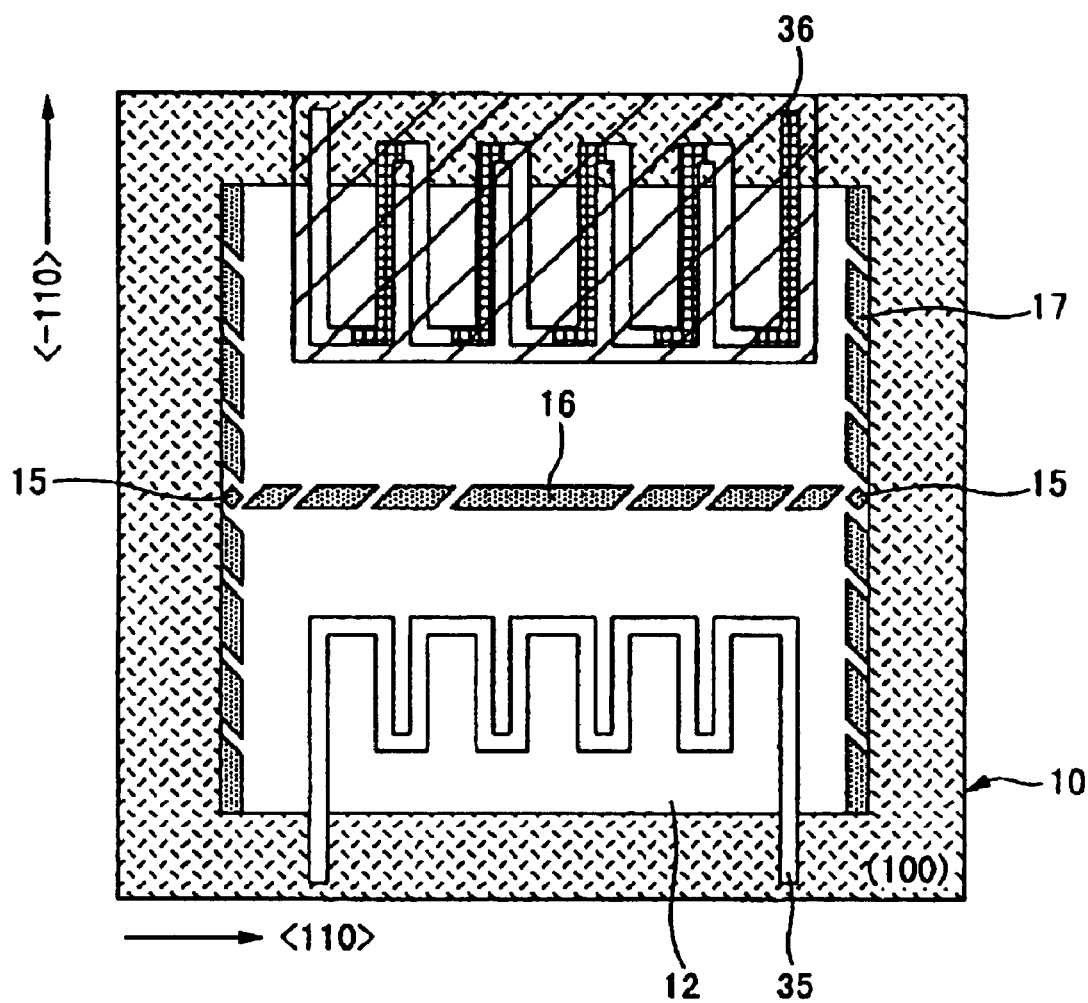
FIG. 18 is top view showing another preferred embodiment of a semiconductor device according to the present invention.
Figure 19:
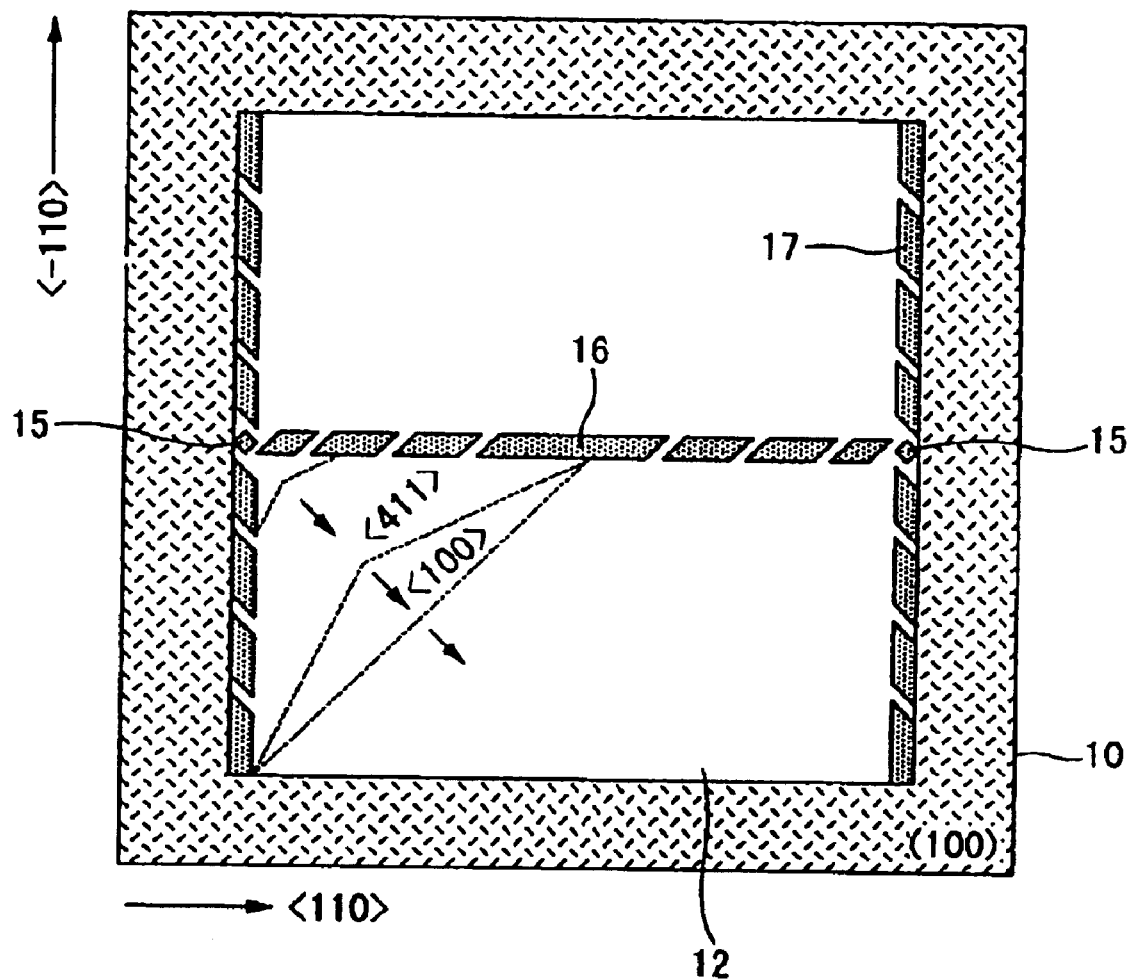
FIG. 19 is a drawing explaining the concavity manufacturing process for the semiconductor devices shown in FIG. 17 and FIG. 18.

FIG. 17–FIG. 19 show another embodiment of the present invention. That is to say, although the first and second etching holes form a cross-shaped intersection in the above mentioned embodiment, the present embodiment forms an H shape.

That is to say, although a first etching hole 16 is provided in the same manner extended in the <110> direction at a center of the formation position of concavity 14, two second etching holes 17 extending in the <-110> direction are provided at both ends of etching hole 16 so as to extend along the perimeter edge of the formation region of concavity 14.

In this embodiment, each etching hole 16 and 17 is formed as a parallelogram, and square-shaped etching holes 15 are placed at the intersection part. However, it is possible to adopt various types of morphologies in the same manner as each of the above mentioned transformed examples for the shapes of the various holes.

Furthermore, resistor element wiring 35a and 35b is provided on the surface of dielectric film 12. This resistor element wiring 35a and 35b winds back and forth several times. Both ends of resistor element wiring 35a and 35b are placed at the exterior of concavity 14. Heat is generated by the flow of electrical current through this resistor element wiring 35a and 35b. That is to say, resistor elements wiring 35a and 35b form heater wires, and forms a micro-heater or flow sensor in the entire semiconductor device.

Moreover, one resistor element wiring (first resistor element) 35a may be constructed to heat, and the other resistor element wiring (second resistor element) 35b may be constructed to function as a sensor of temperature change (detecting temperature change due to the resultant change in resistivity).

Moreover, items formed on the upper surface of dielectric film 12 are not limited to resistor element wiring as described previously. As shown in FIG. 18, construction is also permissible by formation of resistor element wiring 35 functioning as a heater for generation of heat when electricity is passed through the heater and by formation of a thermocouple 36 as a thermoelectric conversion element that senses temperature change.

In either case, although a first etching hole 16 is provided traversing the central position of concavity 14, two large rectangles are found to result upon consideration of the regions divided by each etching hole 16 and 17 within dielectric film 12 above concavity 14. Respective heater element wiring 35a, 35b, and 35 or thermocouples 36 can be placed in these rectangular regions. In other words, wiring can be wound about in a very large region such that high output becomes possible.

Furthermore, as made clear by the figures, winding direction of resistor element 35a, 35b, and 35 of thermocouple 36 can be parallel to the dicing direction of the device. The flow direction of liquid under measurement at the time of mounting can be made parallel to the semiconductor device, and operational efficiency increases.

For the semiconductor device constructed as shown in FIG. 17 and FIG. 18, etching solution can permeate the silicon substrate after formation of etching holes in dielectric film 12 in the same manner as each of the above mentioned embodiments for production of concavity 14. Etching then proceeds first by etching the surface of exposed silicon substrate via each etching hole 16 and 17 and then by etching in the directions perpendicular to the oblique sides, and an H-shape is removed.

Since (411) surfaces emerge by this means, etching proceeds toward these (411) surfaces as indicated by the broken lines in FIG. 19, and the advance of etching is finally controlled by a (100) surface. Therefore a rectangle-shaped concavity is formed. Furthermore, other structures as well as the resultant effect, driving principles, etc. of etching are the same as that of each above mentioned embodiment and transformation example. Therefore detailed explanation thereof will be omitted.

Also, in the various above mentioned embodiments, layout of the first etching hole 16 and the second etching hole 17 was a cross shape or H shape. However, the present invention is not limited to such shapes. For example, it is possible to adopt various other types of patterns such as placement of the first etching hole at the perimeter edge of the dielectric film to form an overall U shape (providing respective second etching holes at either end of a single row of first etching holes), an L shape (providing second etching hole at one tip of a single row of first etching holes), etc.

As explained above, the region upon the dielectric film divided by the first and second etching holes simplifies the wiring patter which becomes rectangular for the semiconductor device according to the present invention. Therefore concern over cutting of the interconnect pattern is inhibited as much as possible, and yield is improved. Moreover, since it becomes possible to use many linear parts with a low number of U-bends, it becomes possible to lower wiring resistivity and to attain miniaturization.

Moreover, since the rapidly etched (411) face can be used when the concavity is produced by etching through an etching hole, it is possible to produce the concavity during a short time interval.

In particular, according to an embodiment of the present invention, the surface of the dielectric film opposite the concavity can be arranged equally into four rectangular regions. Therefore layout of the circuit pattern is readily carried out.

Moreover, according to an embodiment of the present invention, due to an etching hole provided at the intersecting part, etching is rapidly carried out even at the intersecting part, and it is permissible to connect regions removed due to first and second etching holes through regions removed by etching holes. Therefore, the degrees of freedom of layout and morphology of the first and second etching holes increase.

According to an embodiment of the present invention, connecting of first etching holes with one another and connecting of second etching holes with one another are readily carried out, and the degrees of freedom of layout and morphology for each etching hole increase.

Assuming use as an embodying semiconductor device, a circuit pattern can be constructed either by providing a first resistor element of a prescribed morphology that operates by constant generation of heat upon the dielectric film and a second resistor element sensing variation of temperature or by providing a first resistor element of a prescribed morphology that operates by constant generation of heat upon the dielectric film and a thermoelectric conversion element for sensing variation of temperature. In this case, when a second etching hole is provided at the terminal edge of the first etching hole for connecting placement of the first and second etching holes, since resistor elements or thermoelectric elements can be placed over a wide range of regions and with good efficiency, this results in increased element performance.

What is claimed is:

1. A semiconductor device, comprising:
   a semiconductor substrate that has a (100) surface and <110> orientation and that has a concavity formed by anisotropic etching of a surface parallel to the (100) surface;
   a dielectric film provided upon the semiconductor substrate;
   a circuit pattern formed with a predetermined shape upon the dielectric film; and
   a first etching hole and a second etching hole formed in the dielectric film,
   wherein at the dielectric film opposing the concavity, the first etching hole extends in the <110> direction and the second etching hole extends in the <−110> direction;
   wherein the first etching hole and the second etching hole are shaped with sides tilted with respect to the <110> direction and the <−110> direction,
   wherein imaginary rectangles passing through apexes of the first and second etching holes are directly or indirectly continuous, and
   wherein the first and second etching holes facilitate anisotropic etching of the concavity in the semiconductor substrate beneath the dielectric film.

2. The semiconductor device of claim 1, wherein the circuit pattern comprises a resistor element.

3. The semiconductor device of claim 1, wherein the circuit pattern comprises a first resistor element for generation of heat and a second resistor element that senses a temperature change.

4. The semiconductor device of claim 1, wherein the circuit pattern comprises a resistor element for generation of heat and a thermoelectric conversion element that senses a temperature change.

5. The semiconductor device of claim 1, wherein the circuit pattern comprises a thermoelectric conversion element.

6. The semiconductor device of claim 1, wherein the first etching hole and the second etching hole intersect.

7. The semiconductor device of claim 6, wherein a supplementary etching hole is formed at the intersection of adjacent first etching holes.

8. The semiconductor device of claim 6, wherein a supplementary etching hole is formed at the intersection of adjacent second etching holes.

9. The semiconductor device of claim 6, wherein a third etching hole occurs at the intersection of the first etching hole and the second etching hole.

10. The semiconductor device of claim 9, wherein a supplementary etching hole is formed at the intersection of adjacent first etching holes.

11. The semiconductor device of claim 9, wherein a supplementary etching hole is formed at the intersection of adjacent second etching holes.

12. The semiconductor device of claim 6, wherein the intersection occurs at the center of the concavity.

13. The semiconductor device of claim 12, wherein a supplementary etching hole is formed at the intersection of adjacent first etching holes.

14. The semiconductor device of claim 12, wherein a supplementary etching hole is formed at the intersection of adjacent second etching holes.

15. The semiconductor device of claim 12, wherein a third etching hole is formed at the intersection of the first etching hole and the second etching hole.

16. The semiconductor device of claim 15, wherein a supplementary etching hole is formed at the intersection of adjacent first etching holes.

17. The semiconductor device of claim 15, wherein a supplementary etching hole is formed at the intersection of adjacent second etching holes.

* * * * *

UNITED STATES PATENT AND TRADEMARK OFFICE
CERTIFICATE OF CORRECTION

PATENT NO. : 6,737,729 B2
DATED : May 18, 2004
INVENTOR(S) : Masakazu Shiinoki et al.

It is certified that error appears in the above-identified patent and that said Letters Patent is hereby corrected as shown below:

Column 1,
Line 26, please delete "to" after "affects";
Line 50, please insert -- therefore -- before "it becomes necessary";
Line 53, please delete "of" after "consideration".

Column 2,
Line 18, please delete the word "direction" before "and <-110>";
Line 19, please replace "out of" with -- using --;
Line 37, please replace "By this means" with -- Thus --, and insert -- the -- before "imaginary";
Line 44, please insert -- description of the -- after "in detail in the";
Line 45, please replace "in a" after "surface" with -- at --;
Line 48, please replace "is" with -- are --;
Line 62, please delete "to" after "overlaps".

Column 3,
Line 4, please delete "equally" after "maintained", and delete "that" after "symmetrically,";
Line 34, please replace "resister" with -- resistor --.

Column 4,
Line 25, please insert -- a -- before "top view";
Line 28, please insert -- a -- before "top view";
Line 65, please delete "to" after "overlap"

Column 5,
Line 3, please replace "Other" with -- The other --;
Line 10, please insert -- a -- before "flat";
Line 13, please insert -- of the -- before "etching holes";
Line 17, please insert -- the -- before "etching solution".
Line 34, please replace "direction" with -- directions --;
Line 54, please replace "is" with -- are --;
Line 55, please replace "by" with -- as the --.

Column 7,
Line 18, please replace "connects" with -- is connected --;
Lines 38-39, please replace "times passed" with -- time periods --.

UNITED STATES PATENT AND TRADEMARK OFFICE
CERTIFICATE OF CORRECTION

PATENT NO. : 6,737,729 B2
DATED : May 18, 2004
INVENTOR(S) : Masakazu Shiinoki et al.

It is certified that error appears in the above-identified patent and that said Letters Patent is hereby corrected as shown below:

Column 8,
Line 25, please insert -- the -- before "winding element";
Line 42, please replace "the advance of etching" with -- advancement of the etching --;
Line 61, please replace "wiring patter" with -- wiring pattern --;
Lines 62-63, please replace "Therefore concern over cutting of the interconnect pattern is inhibited" with -- Therefore the probability of cutting the interconnect pattern is reduced --.

Signed and Sealed this

Twenty-fourth Day of May, 2005

JON W. DUDAS
*Director of the United States Patent and Trademark Office*